(12) United States Patent
Yuen et al.

(10) Patent No.: US 9,739,818 B2
(45) Date of Patent: Aug. 22, 2017

(54) ELECTROMAGNETIC EFFECT TESTING

(71) Applicant: The Boeing Company, Chicago, IL (US)

(72) Inventors: Felix D. Yuen, Newcastle, WA (US); Andrew M. Robb, Ravensdale, WA (US); Jason P. Bommer, Tacoma, WA (US)

(73) Assignee: The Boeing Company, Chicago, IL (US)

( * ) Notice: Subject to any disclaimer, the term of this patent is extended or adjusted under 35 U.S.C. 154(b) by 444 days.

(21) Appl. No.: 14/207,514

(22) Filed: Mar. 12, 2014

(65) Prior Publication Data

US 2015/0260775 A1    Sep. 17, 2015

(51) Int. Cl.
| | | |
|---|---|---|
| *G01R 31/00* | (2006.01) | |
| *G01R 15/18* | (2006.01) | |
| *H04Q 9/00* | (2006.01) | |
| *G01R 19/00* | (2006.01) | |
| *B64F 5/60* | (2017.01) | |
| *B64D 45/02* | (2006.01) | |
| *G01R 29/08* | (2006.01) | |

(52) U.S. Cl.
CPC .............. *G01R 31/001* (2013.01); *B64F 5/60* (2017.01); *G01R 15/181* (2013.01); *G01R 19/0092* (2013.01); *G01R 31/008* (2013.01); *H04Q 9/00* (2013.01); *B64D 45/02* (2013.01); *G01R 29/0842* (2013.01)

(58) Field of Classification Search
None
See application file for complete search history.

(56) References Cited

U.S. PATENT DOCUMENTS

| | | | | |
|---|---|---|---|---|
| 4,105,966 A | | 8/1978 | Lennon | |
| 5,383,912 A | * | 1/1995 | Cox | A61B 5/0031 128/903 |
| 5,473,244 A | * | 12/1995 | Libove | G01R 1/22 324/126 |
| 5,594,603 A | * | 1/1997 | Mori | G05B 19/404 318/560 |
| 5,697,958 A | * | 12/1997 | Paul | A61N 1/37 128/901 |
| 6,313,623 B1 | * | 11/2001 | Kojovic | G01R 15/181 324/127 |
| 7,532,000 B2 | | 5/2009 | Kovach et al. | |

(Continued)

FOREIGN PATENT DOCUMENTS

| | | |
|---|---|---|
| CN | 201096825 Y | 8/2008 |
| EP | 1887366 A2 | 2/2008 |
| EP | 1923701 A1 | 5/2008 |

OTHER PUBLICATIONS

David P. Talaiver, "Development of a Wireless Sensor Network for Lighting Strike Current Flow Detection and Composite Structural Health Monitoring", http://www.learningace.com/doc/5013246/33725db96c59cefb95046f8cd506545e/talaiver-paper-2010.

*Primary Examiner* — Paresh Patel
(74) *Attorney, Agent, or Firm* — Miller, Matthias & Hull LLP

(57) ABSTRACT

A device comprises a circuit board, a Rogowski coil on the circuit board, persistent data storage on the circuit board, and a control circuit on the circuit board for collecting values representing current sensed by the coil, and storing the values in the persistent memory.

13 Claims, 5 Drawing Sheets

(56) References Cited

U.S. PATENT DOCUMENTS

| | | | |
|---|---|---|---|
| 7,535,233 B2 * | 5/2009 | Kojovic | G01R 31/085 324/509 |
| 7,714,743 B1 | 5/2010 | Woodell | |
| 8,264,215 B1 * | 9/2012 | Kovach | B64D 45/02 307/11 |
| 8,710,824 B2 * | 4/2014 | Ibuki | G01R 15/142 324/126 |
| 2001/0024115 A1 | 9/2001 | Medelius | |
| 2003/0151397 A1 * | 8/2003 | Murphy | G01R 29/0842 324/72 |
| 2012/0029853 A1 | 2/2012 | Baumheinrich | |

* cited by examiner

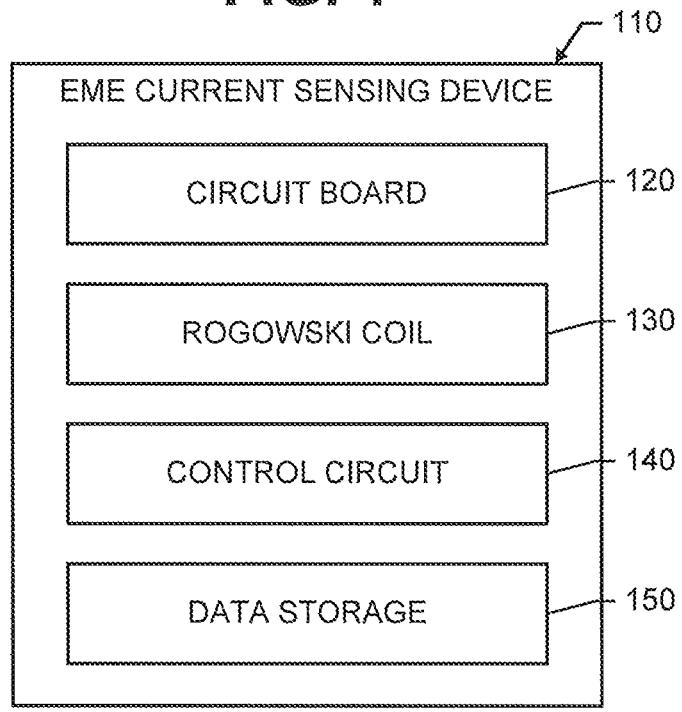
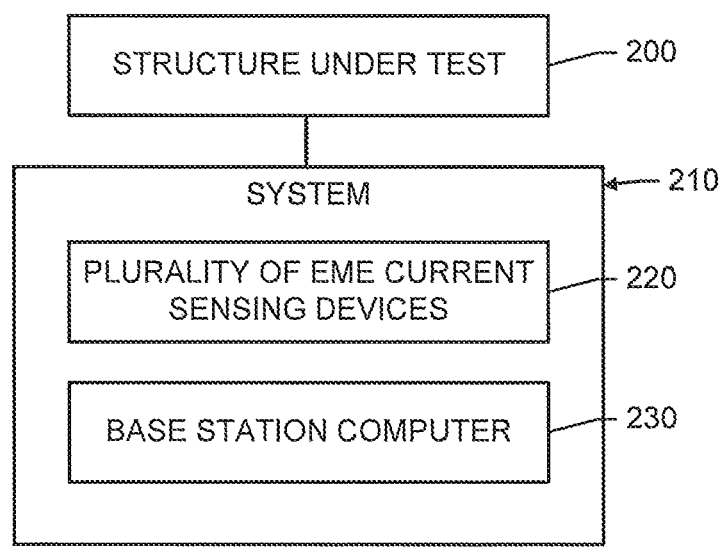

ELECTROMAGNETIC EFFECT TESTING

BACKGROUND

Lightning strikes are a concern of the aircraft, power generation, and petrochemical industries. Certain structures in these industries are susceptible to lightning strikes. Very hot, high-current lightning channels can attach to these structures and cause physical damage.

Lab tests may be conducted to study the effects of lightning upon a structure. For example, a plurality of sensors such as Rogowski coils are attached to a structure, and each sensor is wired to a power source and an oscilloscope. A lightning waveform is then applied to the structure, and measurements taken by the sensors are streamed to the oscilloscopes as the waveform is being applied. The measurements reveal a path of lightning strike current through the structure.

Data can be corrupted during the streaming. It would be desirable to reduce the data corruption.

SUMMARY

According to an embodiment herein, a device comprises a circuit board, a Rogowski coil on the circuit board, persistent data storage on the circuit board, and a control circuit on the circuit board for collecting values representing current sensed by the coil, and storing the values in the persistent memory.

According to another embodiment herein, a current sensing device comprises an electromagnetic effect (EME) current sensor, and a control circuit for buffering values from the current sensor, using the values to detect an EME event, and constructing a full current waveform from those values buffered during a first period immediately preceding the EME event and a period immediately following the EME event.

According to another embodiment herein, a method comprises fastening a plurality of circuit boards to a structure with fasteners. Each circuit board includes a Rogowski coil surrounding one of the fasteners. The method further comprises collecting sensor measurements from the coils and storing the measurements on the circuit boards; and subjecting the structure to an EME event while continuing to collect additional sensor measurements from the coils and store the additional sensor measurements on the circuit boards. After the EME event has ended, the stored measurements are retrieved from the circuit boards.

These features and functions may be achieved independently in various embodiments or may be combined in other embodiments. Further details of the embodiments can be seen with reference to the following description and drawings.

BRIEF DESCRIPTION OF THE DRAWINGS

FIG. 1 is an illustration of an EME current sensing device.

FIG. 2 is an illustration of a system for sensing EME current in a structure.

DETAILED DESCRIPTION

Figure 3:
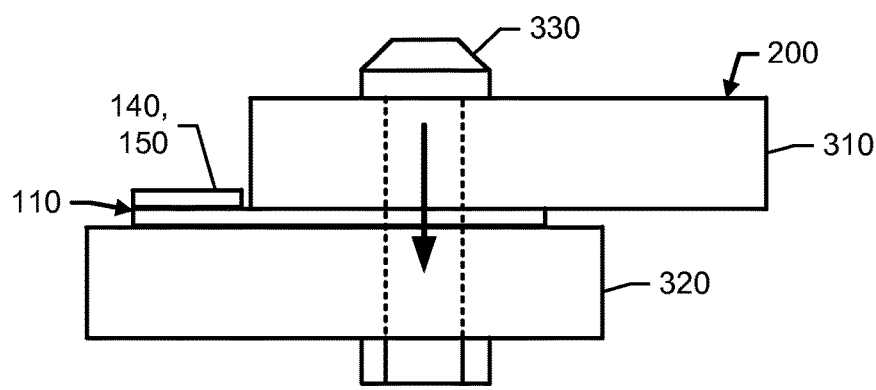
FIG. 3 is an illustration of a composite structure.

Reference is made to FIG. 1, which illustrates a device 110 for sensing electromagnetic effect (EME) current. The current sensing device 110 includes a circuit board 120, and a Rogowski coil 130 on the circuit board 120. The Rogowski coil 130 surrounds a metal core (e.g., a fastener) and functions as a current sensor. The Rogowski coil 130 generates transient pulses in response to EME current flowing through the core.

The current sensing device 110 further includes a control circuit 140 and persistent data storage 150 on the circuit board 120. The control circuit 140 collects values representing current sensed by the Rogowski coil 130. For instance, the control circuit 140 includes an analog integrator for integrating the transient pulses generated by the Rogowski coil 130, an analog to digital (ND) converter for converting the analog values from the integrator to digital values, and a controller for storing the digital values in the persistent data storage 150. The persistent data storage 150 may include random access memory.

The control circuit 140 and the data storage 150 may be protected against EME by a ferromagnetic shield. The ferromagnetic shield may enclose the control circuit 140 and the data storage 150.

A plurality of these EME current sensing devices 110 may be used to sense EME current flowing though a structure. For example, a plurality of the sensing devices 110 may be used to study the effects of a lightning strike on a structure.

Reference is made to FIG. 2, which illustrates a system 210 for sensing EME current that flows though a structure 200 during an EME event. The system 210 includes a plurality 220 of the EME current sensing devices 110 fastened to the structure 200. Some of the sensing devices 110 may be fastened to an upper surface of the structure 200, and some of the sensing devices 110 may be fastened to a lower surface of the structure 200. For a structure 200 having parts that are fastened together, some of the sensing devices 110 may be clamped between the parts. A sensing device 110 may be fastened to the structure 200 by inserting a fastener 330 through a hole in the circuit board 120 and through the Rogowski coil 130.

Consider the example of a structure 200 illustrated in FIG. 3. The structure 200 includes first and second composite parts 310 and 320 that are fastened together by metal fasteners 330 (only a single fastener 330 is shown in FIG. 3). The parts 310 and 320 may be made of a composite material such as carbon fiber reinforced plastic (CFRP). A sensing device 110 may be fastened to the structure 200 of FIG. 3 by clamping the circuit board 120 between the parts 310 and 320, with the fastener 330 extending through the Rogowski coil 130. The control circuit 140 and data storage 150 are located at the end of the circuit board 120.

When the structure 200 is subjected to an EME event, current may flow through the fastener 330. For instance, if lightning attaches to a head of the fastener 330, current may flow through the fastener 330 in the direction of the arrow. Or if EME current flows along the surface of the composite part 310 and then reaches the fastener 330, the current may flow through the fastener 330 in the direction of the arrow. The Rogowski coil 130 senses the current flowing through the fastener 330.

In some embodiments, the system 210 may further include an artificial source of EME current. For example, the artificial source may include a current generator. In other embodiments, the source of EME current may be natural. For example, the structure may be placed in an environment where it is exposed to lightning. An EME event occurs when EME current is applied to the structure 200.

The system 210 further includes a base station including a computer 230 programmed to query the sensing devices 110 to obtain information about EME current flowing through the structure 200 during an EME event. The query may be made after the EME event has occurred. When queried, each sensing devices 110 may provide its buffered digital values and/or additional information (e.g., a full current waveform). Communications between the base station computer 230 and the current sensing devices 110 may be wired or wireless.

The base station computer 230 may be programmed to process the collected information to map a path of current flowing through the structure 200. Entry points of current entering the structure 200 may be the points where current is applied to the structure 200. An entry point may or may not be a fastener. Exit points of current exiting the structure 200 may be determined by a grounding scheme. Between the entry and exit points, the sensing devices 110 provide measurements of current flow in each of the fasteners. With these known points and measurements, a 3D map of current flow in the structure 200 may be created. The 3D map reveals how EME current passes from surface to surface via the fasteners.

The current measurements may contain time stamps. The time stamps indicate when the measurements were made relative to the detection of an EME event. With these time stamps, the 3D map may also indicate rise time of current at each fastener.

Figure 4:
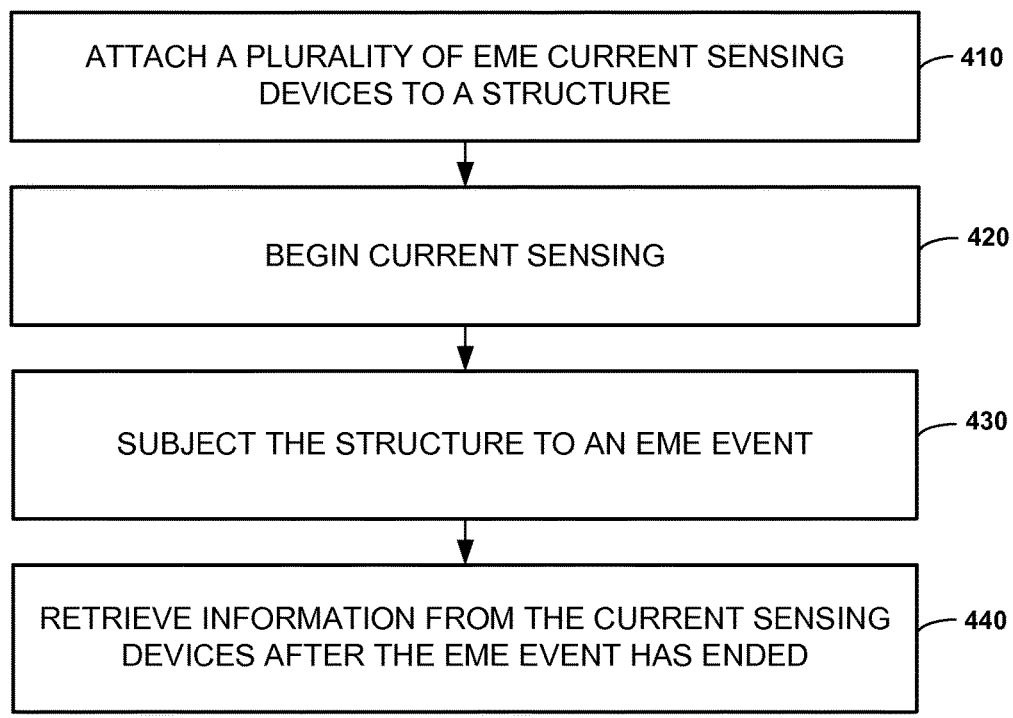
FIG. 4 is an illustration of a method of sensing EME current in a structure.

Reference is made to FIG. 4, which illustrates a method of using the system 210 to map a flow of current through the structure 200 during an EME event. At block 410, a plurality 220 of the EME current sensing devices 110 is fastened to the structure 200. At block 420, current sensing begins, whereby the current sensing devices 110 begin sensing current and storing values representing the sensed current. For instance, current sensing may begin when the current sensing devices 110 are powered on.

At block 430, the structure 200 is subjected to an EME event. During the EME event, the current sensing devices 110 continue storing values representative of sensed current.

The structure 200 may be subjected to the EME event in a lab or in the field. As an example of in-field testing, the structure 200 with attached current sensing devices 110 may be sent up in a weather balloon into a lightning storm. If lightning attaches to the structure 200 during the storm, the sensing devices 110 will sense the current flowing in the structure 200 and store values representing the current.

As an example of testing in a lab, a plurality of sensing devices 110 are fastened to different locations inside a mock up of an aircraft wing. A lightning strike is then simulated by injecting a waveform into the wing.

At block 440, after the EME event has ended, the stored values from the sensing devices 110 are retrieved. For instance, the base station computer 230 polls the current sensing devices 110 and, in response, the devices 110 transmit the stored information to the base station computer 230.

Because the EME event has already settled, the EME event does not corrupt the information sent to the base station computer 230. In addition to eliminating the corruption of the information during testing, the use of expensive oscilloscopes is eliminated. Eliminating the use of oscilloscopes enables a greater number of sensors to be used (since they're not limited by the number of oscilloscopes in use).

Moreover, communications between the sensing devices 110 and the base station computer 230 may be wireless, which eliminates wires and reduces setup time. In addition to reducing expensive test equipment, the test procedures are streamlined.

Figure 5:
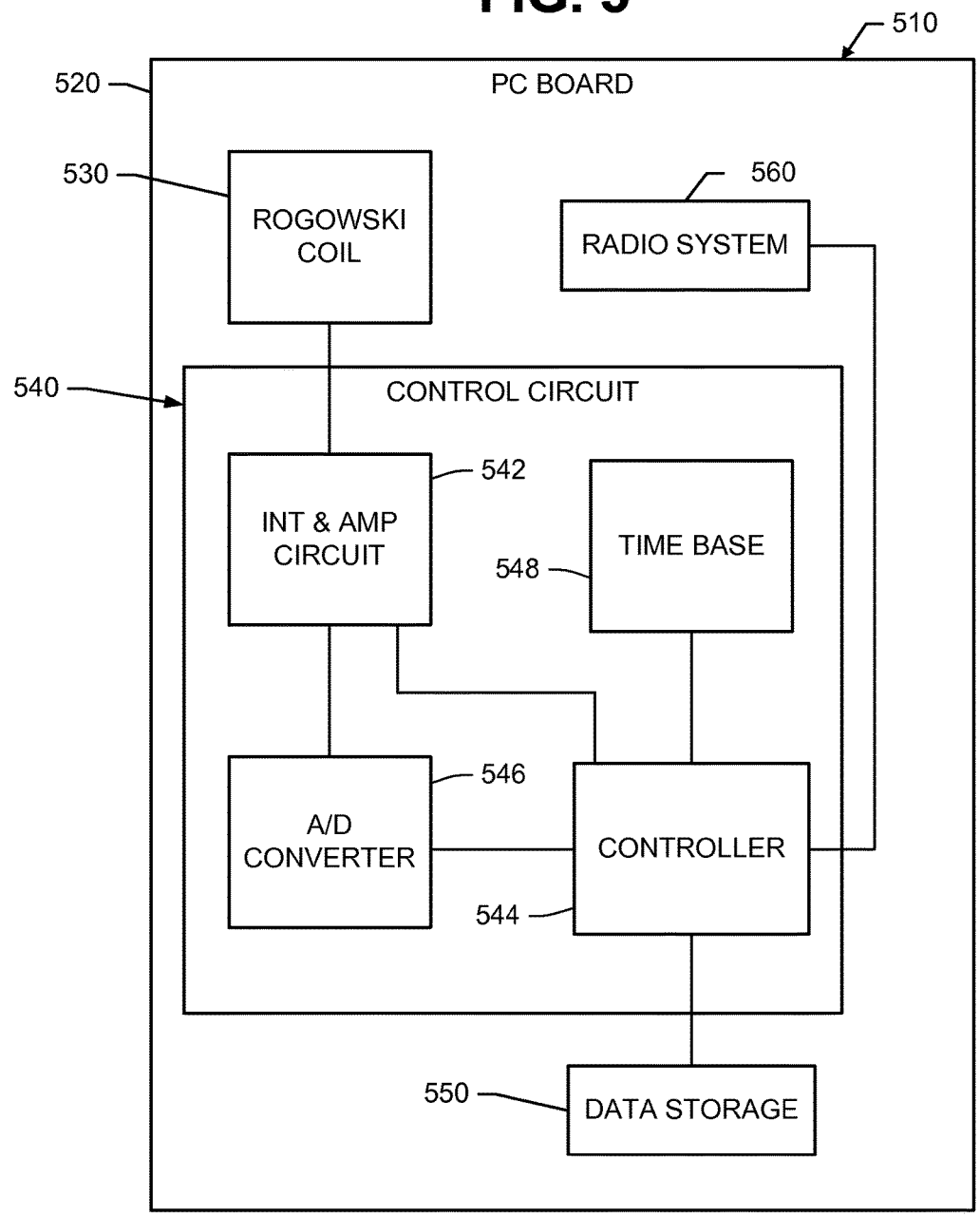
FIG. 5 is an illustration of an EME current sensing device.

Reference is made to FIG. 5, which illustrates an example of a current sensing device 510. The device 510 includes a multi-layer printed circuit board 520. A Rogowski coil 530 may be formed on the printed circuit board 520 as described in the assignee's U.S. Pat. No. 7,532,000. For the example of a six layer printed circuit board 520, layers 2-5 are used to create loops that form the Rogowski coil 530. The loops may be symmetric. Layers 1 and 6 of the printed circuit board 520 may be used as ground planes to reduce noise. A ferromagnetic shield for the Rogowski coil 530 is not needed.

A control circuit 540 is also mounted on the printed circuit board 520. The control circuit 540 includes an integration and amplification circuit 542 proximate the Rogowski coil 530. The integration and amplification circuit 542 may utilize the passive integrator described in the assignee's U.S. Pat. No. 7,532,000. The passive integrator includes a variable resistor and capacitor.

In the alternative, the integration and amplification circuit 542 may utilize an active integrator. The active integrator may include an operational amplifier.

The control circuit 540 further includes an analog-to-digital (A/D) converter 546 for converting an output of the integration and amplification circuit 542 from an analog value to a digital value. The control circuit 540 further includes a controller 544. Certain functions performed by the controller 544 are illustrated in FIG. 6.

Figure 6:
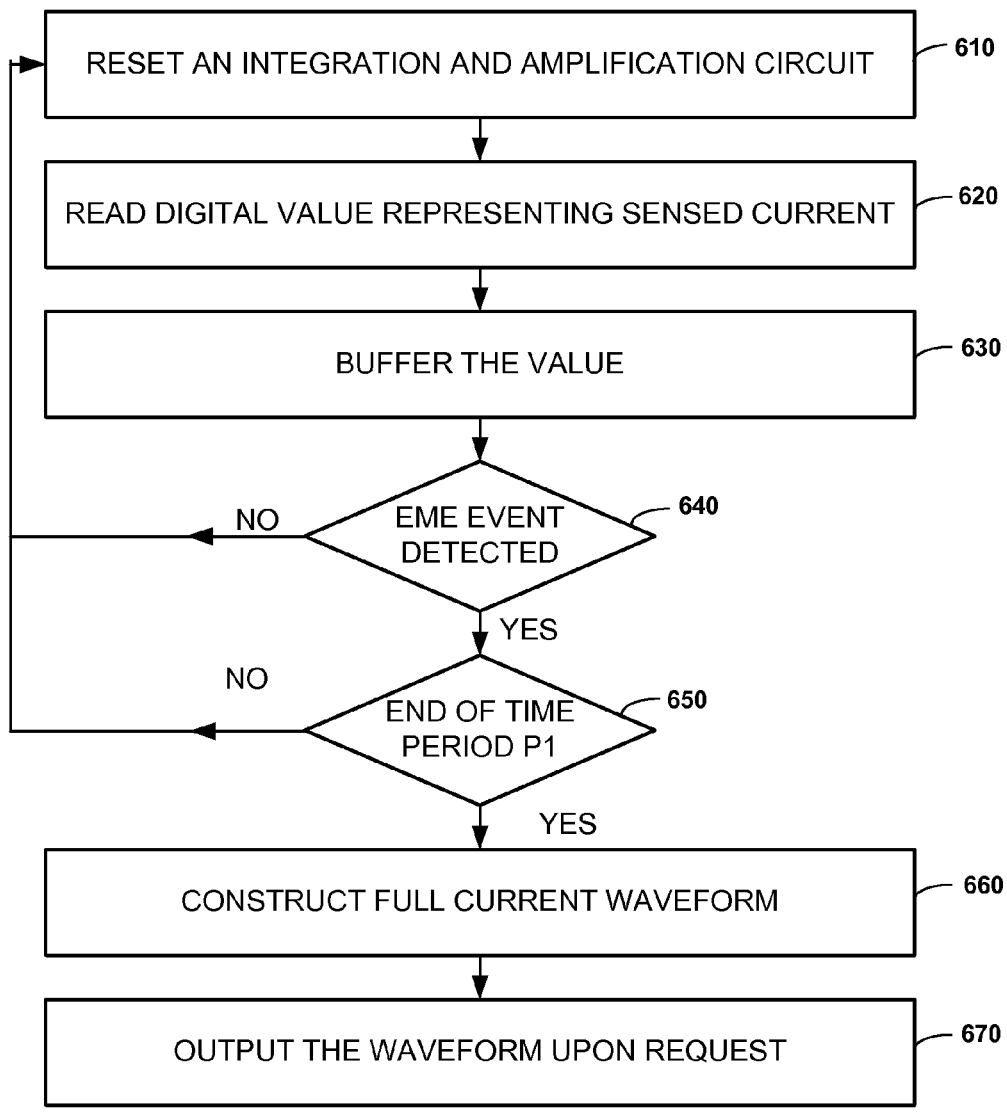
FIG. 6 is an illustration of a certain functions performed by a controller of the EME current sensing device of FIG. 5.

Additional reference is made to FIG. 6. At the beginning of current sensing, the controller 544 resets the integration and amplification circuit 542 (block 610). At the end of an integration period, the controller 544 reads a digital value from the A/D converter 546 (block 620). The digital value represents current sensed by the Rogowski coil 530. The controller 544 then buffers the digital value in the data storage 550 (block 630). The control circuit 540 may further include a time base 548 (e.g., a system clock), which the controller 544 may use to add a time stamp to each buffered value.

The controller 544 also analyzes each buffered value to detect the occurrence of an EME event (block 640). This detection may be performed, for example, by comparing the buffered digital value to a threshold. The controller 544 buffers additional values in the data storage 550 until the threshold is exceeded (that is, blocks 610-640 are repeated). When the threshold is exceeded, the controller 544 refers to the time base 460 for the time of the detected EME event.

Figure 7:
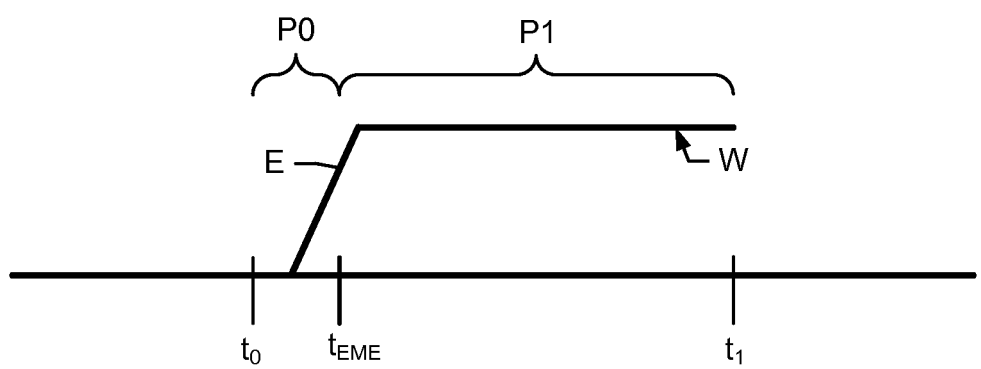
FIG. 7 is an illustration of a current waveform that was constructed from values stored during periods immediately preceding and following a detected EME event.

Additional reference is made to FIG. 7. After an EME event has been detected, the controller 544 continues buffering additional values for a first period (P1) after the EME event has been detected (block 650). The first period (P1) begins at the time $t_{EME}$ that the EME event was detected, and it ends at time $t_1$.

Alter the first period (P1) has ended, the controller 544 constructs a full current waveform from the buffered values (block 660). The controller 544 may discard all values buffered earlier than time $t_0$ and keep all values buffered during a second period (P0) from time t0 to time $t_{EME}$. Thus, this second period (P0) occurred immediately before the EME event was detected. As but one example, the second period (P0) has a duration of about fifty microseconds, and the second period (P1) has a duration of no more than 300-450 microseconds.

The controller 544 then combines the values stored during the two per to construct a full current waveform W. The full current waveform W is also stored in the data storage 550.

The full waveform W provides valuable information about current flowing through a fastener as the result of a lightning strike or other EME event. For instance, the leading edge E of the full waveform reveals rise time of current in the fastener. The rise time in a single fastener can provide information about voltage induced by the EME event. A comparison of rise times across different fasteners may provide information about how current flows through the structure (e.g., whether current is dispersed or delayed).

The controller 544 then outputs the waveform upon request (block 670). For instance, the controller 544 waits for a query from the base station computer. Once the query is received, the controller 544 transmits the full waveform to the base station computer.

The current sensing device 510 may further include a radio system 560 for wireless communications with the base station computer. The radio system 560 may follow a protocol such as RFID, Bluetooth, WiFi, Zigbee, or other wireless protocol.

The current sensing device 510 may receive operational power from an external source. The current sensing device 510 may also include a battery (not shown) for backup power.

Thus, data acquisition, data storage, and wireless transmission are all performed on a single printed circuit board 520 that is relatively small. The printed circuit board 520 may have a length of only several inches.

Placing the integration and amplification circuit 542 proximate the Rogowski coil 530 also reduces noise in the transient pulses. In contrast, pulses sent to a remote location via wires would have far greater exposure to an EME event.

The sensing devices 110 and 510 described above may have only a single Rogowski coil per circuit board 120 and 520. However, a sensing device herein is not so limited. Some embodiments may include multiple Rogowski coils for sensing current through multiple fasteners. A dedicated control circuit may be provided for each Rogowski coil.

The sensing devices 110 and 510 are not limited to sensing current that flows through a fastener. The sensing devices may sense current flowing through a post, wire, or any other object that can fit within the Rogowski coil.

The invention claimed is:

1. A device comprising:
   a circuit board;
   a Rogowski coil on the circuit board, the Rogowski coil configured to generate transient pulses in response to electromagnetic effect (EME) current;
   persistent data storage on the circuit board; and
   a control circuit on the circuit board for collecting values representing current sensed by the coil, and storing the values in the persistent data storage, the control circuit including an analog integrator for integrating the transient pulses generated by the Rogowski coil to produce analog values, an analog to digital converter for converting analog values from the analog integrator to digital values, and a controller for storing the digital values in the persistent data storage, the controller configured to:
   detect an electromagnetic effect (EME) event;
   store values for a first period after the EME event has been detected;
   store values for a second period immediately preceding the EME event; and
   construct a full current waveform for the values stored during the first and second periods, wherein the full current waveform includes a rise time of current induced by the EME event.

2. The device of claim 1, wherein the circuit board is a multi-layer printed circuit board; and wherein the Rogowski coil is formed in multiple layers of the circuit board.

3. The device of claim 1, further comprising a ferromagnetic shield covering the data storage and the control circuit.

4. The device of claim 1, wherein the circuit board has a length of several inches.

5. The device of claim 1, wherein the first period is about 50 microseconds, and the second period is between 300 and 450 microseconds.

6. The device of claim 1, wherein the control circuit is configured to transmit the full current waveform upon request from a base computer communicatively coupled to the device.

7. The device of claim 1, further comprising a wireless transmitter for transmitting the full current waveform.

8. A system for analyzing a structure during an electromagnetic effect (EME) event, the system comprising a plurality of the devices of claim 1 fastened to the structure.

9. The system of claim 8, further comprising a computer programmed to query the devices to collect information about current flowing through the structure during the EME event, the devices queried after the EME event has ended.

10. The system of claim 9, wherein the devices includes wireless transmitters for communicating wirelessly with the computer.

11. The system of claim 9, wherein the computer is further programmed to process the collected information to map a path of EME current that flowed through the structure during the EME event.

12. The device of claim 1, wherein the device is further configured to output the full current waveform, whereby a lightning strike may be simulated by injecting the waveform into a wing structure to which the Rogowski coil is coupled.

13. The device of claim 1, wherein the controller is further configured to store the full current waveform in the persistent data storage.

* * * * *